(12) United States Patent
Tasic et al.

(10) Patent No.: US 10,439,858 B2
(45) Date of Patent: *Oct. 8, 2019

(54) MULTIPLEX MODULES FOR CARRIER AGGREGATION RECEIVERS

(71) Applicant: QUALCOMM Incorporated, San Diego, CA (US)

(72) Inventors: Aleksandar Miodrag Tasic, San Diego, CA (US); Chiewcharn Narathong, Laguna Niguel, CA (US); Christian Holenstein, La Mesa, CA (US); Dongling Pan, San Diego, CA (US); Yiwu Tang, San Diego, CA (US); Rajagopalan Rangarajan, San Diego, CA (US); Lai Kan Leung, San Marcos, CA (US)

(73) Assignee: QUALCOMM Incorporated, San Diego, CA (US)

( * ) Notice: Subject to any disclaimer, the term of this patent is extended or adjusted under 35 U.S.C. 154(b) by 61 days.

This patent is subject to a terminal disclaimer.

(21) Appl. No.: 15/715,006

(22) Filed: Sep. 25, 2017

(65) Prior Publication Data

US 2018/0013600 A1 Jan. 11, 2018

Related U.S. Application Data

(63) Continuation of application No. 14/664,492, filed on Mar. 20, 2015, now Pat. No. 9,774,485.
(Continued)

(51) Int. Cl.
H04L 27/26 (2006.01)
H04L 12/761 (2013.01)
(Continued)

(52) U.S. Cl.
CPC ......... *H04L 27/2653* (2013.01); *H03F 1/223* (2013.01); *H03F 3/193* (2013.01);
(Continued)

(58) Field of Classification Search
None
See application file for complete search history.

(56) References Cited

U.S. PATENT DOCUMENTS 7,116,952 B2 10/2006 Arafa
7,869,528 B2 1/2011 Robinson
(Continued)

FOREIGN PATENT DOCUMENTS

CN 1393064 A 1/2003
CN 1890898 A 1/2007
(Continued)

OTHER PUBLICATIONS

International Search Report and Written Opinion—PCT/US2015/022055—ISA/EPO—dated Aug. 28, 2015, 16 pages.

*Primary Examiner* — Mohammad S Adhami
(74) *Attorney, Agent, or Firm* — Qualcomm Incorporated-Toler

(57) ABSTRACT

An apparatus includes a low noise amplifier (LNA) multiplexer configured to receive a plurality of radio frequency (RF) signals at a plurality of input terminals and to combine the plurality of RF signals into a combined RF signal that is output at an output terminal. The LNA multiplexer includes a plurality of input signal paths, and each input signal path is coupleable to a respective input terminal of the plurality of input terminals and is configured to receive a respective RF signal of the plurality of RF signals. The apparatus further includes an LNA demultiplexer configured to receive the combined RF signal at an input port coupled to the output terminal and to distribute the combined RF signal to
(Continued)

a plurality of output ports, each output port of the plurality of output ports configured to output the combined RF signal to a respective downconverter of a plurality of downconverters.

18 Claims, 7 Drawing Sheets

Related U.S. Application Data

(60) Provisional application No. 61/994,167, filed on May 16, 2014, provisional application No. 61/994,175, filed on May 16, 2014.

(51) Int. Cl.
    *H04L 12/709*     (2013.01)
    *H03F 1/22*     (2006.01)
    *H04B 1/00*     (2006.01)
    *H03F 3/193*     (2006.01)
    *H03F 3/24*     (2006.01)
    *H04L 5/00*     (2006.01)

(52) U.S. Cl.
CPC ........... *H03F 3/245* (2013.01); *H04B 1/0064* (2013.01); *H04L 5/001* (2013.01); *H04L 27/2647* (2013.01); *H04L 45/16* (2013.01); *H04L 45/245* (2013.01)

(56) References Cited

U.S. PATENT DOCUMENTS

| | | | |
|---|---|---|---|
| 8,045,592 B2 | 10/2011 | Combi et al. | |
| 8,086,197 B2 | 12/2011 | Doris et al. | |
| 8,774,068 B2 | 7/2014 | Bengtsson et al. | |
| 9,473,336 B2 | 10/2016 | Pan et al. | |
| 9,774,485 B2 * | 9/2017 | Tasic | H04L 27/2653 |
| 2005/0249501 A1 * | 11/2005 | Wolcott | H04B 10/1127 |
| | | | 398/118 |
| 2006/0099925 A1 * | 5/2006 | Tsai | H04B 7/0842 |
| | | | 455/272 |
| 2007/0001768 A1 | 1/2007 | Kim et al. | |
| 2009/0108911 A1 | 4/2009 | Nakahara et al. | |
| 2009/0176467 A1 | 7/2009 | Im et al. | |
| 2011/0110452 A1 | 5/2011 | Fukamachi et al. | |
| 2012/0182430 A1 | 7/2012 | Birkett et al. | |
| 2012/0195237 A1 | 8/2012 | Chan et al. | |
| 2012/0236830 A1 | 9/2012 | Takano et al. | |
| 2012/0327825 A1 | 12/2012 | Gudem et al. | |
| 2013/0043946 A1 | 2/2013 | Hadjichristos et al. | |
| 2013/0336181 A1 | 12/2013 | Khlat et al. | |
| 2014/0003300 A1 | 1/2014 | Weissman et al. | |
| 2014/0036777 A1 | 2/2014 | Kokkinos et al. | |
| 2014/0072001 A1 | 3/2014 | Chang et al. | |
| 2014/0113578 A1 | 4/2014 | Xu et al. | |
| 2015/0092680 A1 | 4/2015 | Kahrizi et al. | |
| 2015/0244404 A1 | 8/2015 | Liu et al. | |
| 2015/0280654 A1 * | 10/2015 | Kehrer | H03F 1/26 |
| | | | 455/293 |
| 2015/0304000 A1 | 10/2015 | Wloczysiak | |
| 2015/0333949 A1 | 11/2015 | Tasic | |
| 2015/0373711 A1 | 12/2015 | Narathong et al. | |
| 2016/0191092 A1 * | 6/2016 | Liao | H04B 1/006 |
| | | | 455/307 |

FOREIGN PATENT DOCUMENTS

| | | |
|---|---|---|
| CN | 103780280 A | 5/2014 |
| WO | 2009157357 A1 | 12/2009 |
| WO | 2014043270 A1 | 3/2014 |

* cited by examiner

MULTIPLEX MODULES FOR CARRIER AGGREGATION RECEIVERS

CROSS-REFERENCE TO RELATED APPLICATIONS

The present application claims priority from and is a continuation of U.S. patent application Ser. No. 14/664,492 filed on Mar. 20, 2015, which claims the benefit of and priority from U.S. Provisional Patent Application No. 61/994,167 filed on May 16, 2014, and U.S. Provisional Patent Application No. 61/994,175 filed on May 16, 2014, the contents of which are expressly incorporated herein by reference in their entirety.

BACKGROUND

I. Field

The present disclosure relates generally to transceivers, and more specifically to multiplex modules for improved signal routing in carrier aggregation receivers.

II. Background

In a radio frequency (RF) transceiver, a communication signal is developed, unconverted, amplified and transmitted by a transmitter and is received, amplified, downconverted and recovered by a receiver. In the receiver, the communication signal is typically received and downconverted by receive circuitry to recover the information contained in the communication signal. A single transmitter or receiver can be configured to operate using multiple transmit frequencies and/or multiple receive frequencies. For a receiver to be able to simultaneously receive two or more receive signals, the concurrent operation of two or more receive paths is used. Such systems are sometimes referred to as "carrier-aggregation" (CA) systems. The term "carrier-aggregation" may refer to systems that include inter-band carrier aggregation (Inter-CA) and intra-band carrier aggregation (Intra-CA). Inter-CA refers to the processing of two or more separate (either contiguous or non-contiguous) carrier signals that occur in different communication bands. Intra-CA refers to the processing of two or more separate (either contiguous or non-contiguous) carrier signals that occur in the same communication band. A received carrier aggregated RF signal is typically down-converted using one or more distinct local oscillator (LO) frequencies. The downconverted signals are then processed to extract the information transmitted using the multiple carriers.

Communication devices have RF transceivers that are becoming more and more complex as they are designed to handle an ever-increasing number of different frequencies in multiple communication bands. It is common for a communication device to be able to communicate over a variety of different frequencies over many different communication bands. In many cases, the receiver includes multiple receive paths that may have long signal routing paths and duplicate amplification and filtering. Such implementations may have high costs and space requirements while resulting in inconsistent gain, inconsistent impedance matching, and inconsistent current in the different receive paths.

It is therefore desirable to have a cost effective and space efficient way to obtain consistent receiver performance when processing different carrier signals in a carrier aggregation transceiver.

DETAILED DESCRIPTION

The detailed description set forth below is intended as a description of exemplary designs of the present disclosure and is not intended to represent the only designs in which the present disclosure can be practiced. The term "exemplary" is used herein to mean "serving as an example, instance, or illustration." Any design described herein as "exemplary" is not necessarily to be construed as preferred or advantageous over other designs. The detailed description includes specific details for the purpose of providing a thorough understanding of the exemplary designs of the present disclosure. It will be apparent to those skilled in the art that the exemplary designs described herein may be practiced without these specific details. In some instances, well-known structures and devices are shown in block diagram form in order to avoid obscuring the novelty of the exemplary designs presented herein.

Figure 1:
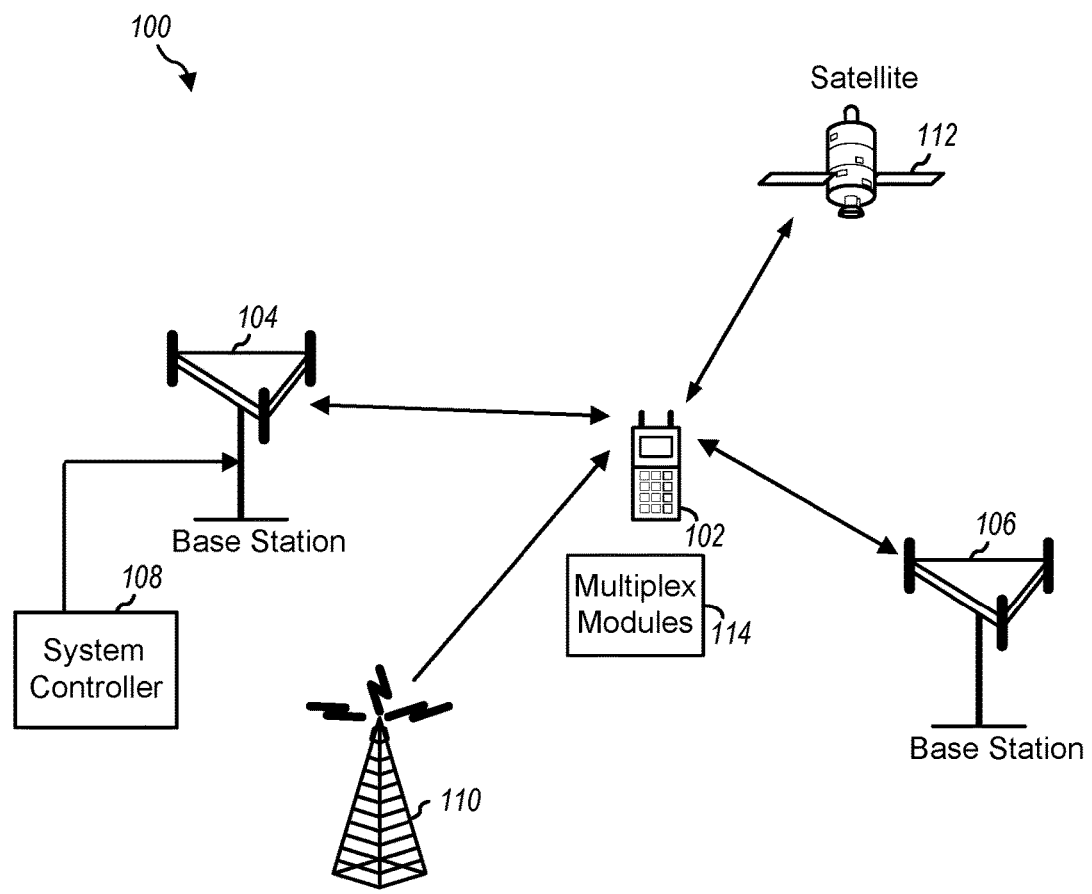
FIG. 1 shows an exemplary embodiment of multiplex modules that efficiently routes received carrier signals to a demodulator in a wireless device communicating within a wireless system.

FIG. 1 shows an exemplary embodiment of multiplex modules 114 that efficiently route received carrier signals to a demodulator in a wireless device 102 communicating within a wireless system 100. Wireless system 100 may be a Long Term Evolution (LTE) system, a Code Division Multiple Access (CDMA) system, a Global System for Mobile Communications (GSM) system, a wireless local area network (WLAN) system, or some other wireless system. A CDMA system may implement Wideband CDMA (WCDMA), CDMA 1x, Evolution-Data Optimized (EVDO), Time Division Synchronous CDMA (TD-SCDMA), or some other version of CDMA. For simplicity, FIG. 1 shows wireless system 100 including two base stations 104 and 106 and one system controller 108. In general, wireless system 100 may include any number of base stations and any set of network entities.

Wireless device 102 may also be referred to as a user equipment (UE), a mobile station, a terminal, an access terminal, a subscriber unit, or a station. Wireless device 102 may be a cellular phone, a smartphone, a tablet, a wireless modem, a personal digital assistant (PDA), a handheld device, a laptop computer, a smartbook, a netbook, a cordless phone, a wireless local loop (WLL) station, a Bluetooth device, or other communicating device. Wireless device 102 may communicate with devices in the wireless system 100. Wireless device 102 may also receive signals from broadcast stations (e.g., a broadcast station 110), or signals from satellites (e.g., a satellite 112) in one or more global navigation satellite systems (GNSS). Wireless device 102 may support one or more radio technologies for wireless communication such as LTE, WCDMA, CDMA 1×, EVDO, TD-SCDMA, GSM, 802.11. In various exemplary embodiments, the multiplex modules 114 efficiently route received carriers in multiple communication bands to a demodulator to obtain consistent receiver performance when processing different carrier signals in multiple communication bands.

Figure 2:
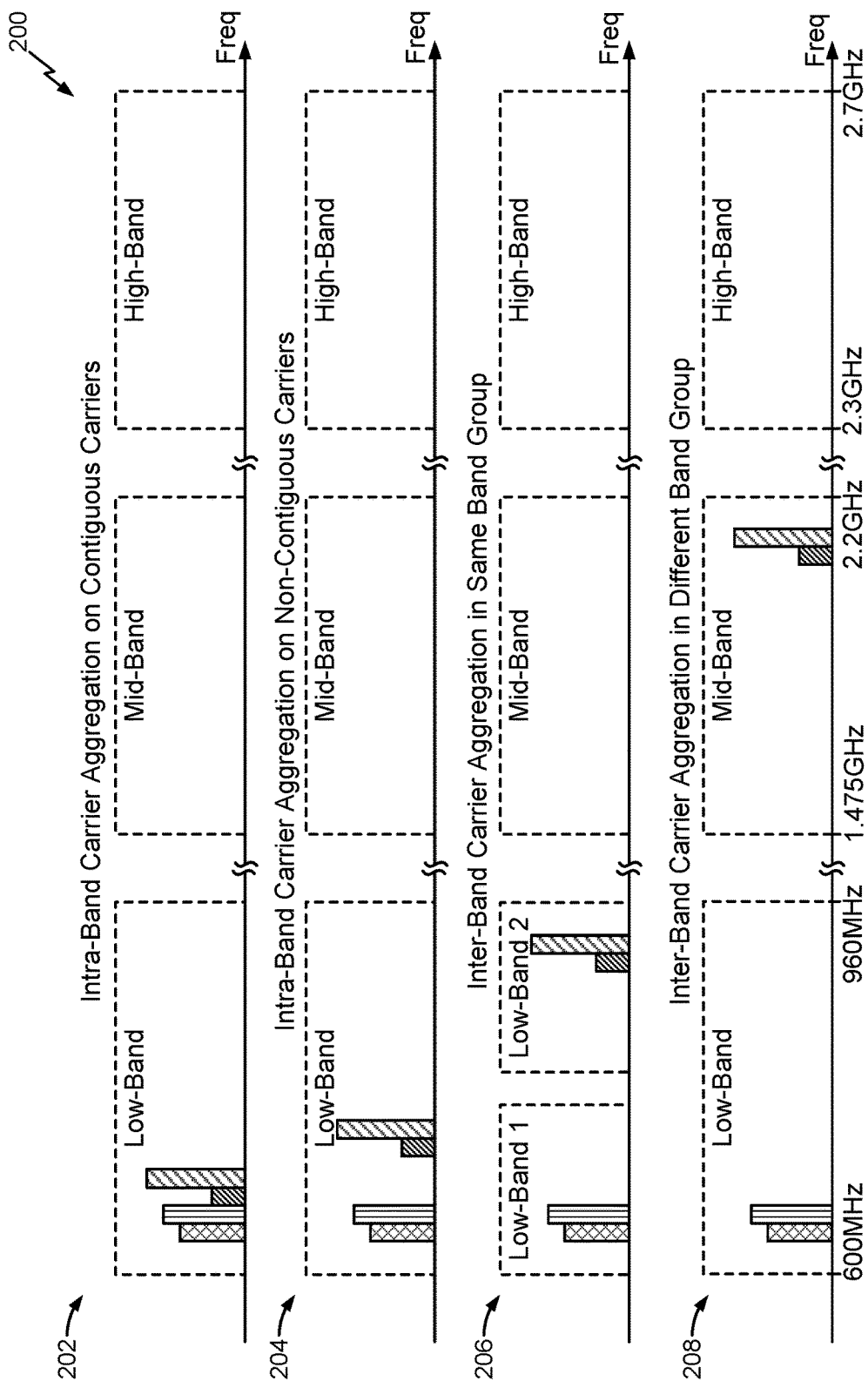
FIG. 2 shows diagrams that illustrate carrier signals in a carrier aggregation communication system.

FIG. 2 shows diagrams 200 that illustrate exemplary signal carrier configurations in a carrier aggregation communication system. For example, the signal configurations show carriers that may be transmitted or received in various band groups of the communication system 100 shown in FIG. 1. For example, the diagrams 200 show low-band, mid-band and high-band groups and each band group may have one or more carrier signals. In diagram 206, the low-band group is further divided into two low band groups.

Diagram 202 shows an illustration of a contiguous intra-band carrier configuration. For example, there are multiple contiguous carriers in one band (e.g., four contiguous carriers in the low-band). Wireless device 100 may send and/or receive transmissions on the four contiguous carriers within the same band.

Diagram 204, shows an illustration of a non-contiguous intra-band carrier configuration. For example, there are multiple non-contiguous carriers in one band (e.g., four non-contiguous carriers in the low-band). The carriers may be separated by 5 MHZ, 10 MHz, or some other amount. Wireless device 100 may send and/or receive transmissions on the four non-contiguous carriers within the same band.

Diagram 206 shows an illustration of an inter-band carrier configuration using the same band group. For example, there are multiple carriers in two bands (e.g., two contiguous carriers in low band 1 and two contiguous carriers in low-band 2). Wireless device 100 may send and/or receive transmissions on the four carriers in different bands in the same band group.

Diagram 208 shows an illustration of an inter-band carrier configuration using different band groups. For example, there are multiple carriers in two bands of different band groups (e.g., two carriers in the low-band group and two carriers in the mid-band group. Wireless device 100 may send and/or receive transmissions on the four carriers in the different band groups. It should also be noted that other carrier configurations using different band groups are also supported by the exemplary embodiments.

Figure 3:
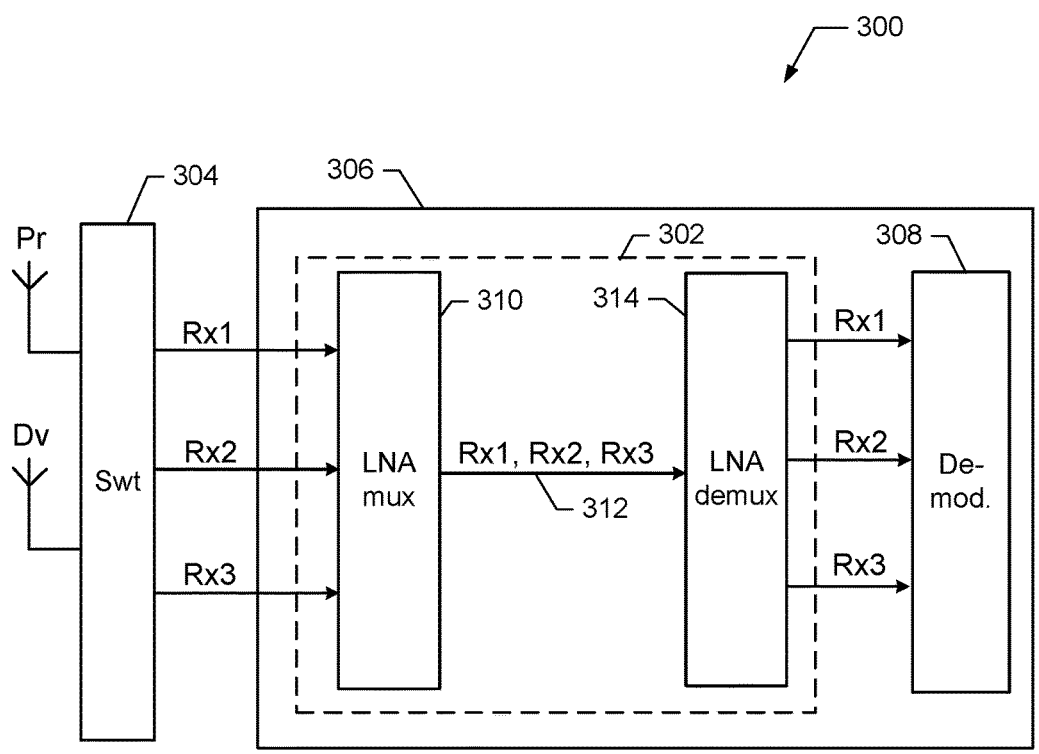
FIG. 3 shows a block diagram of a receiver front end that comprises an exemplary embodiment of a multiplex module.

FIG. 3 shows a block diagram of a receiver front end 300 that comprises an exemplary embodiment of a multiplex module 302. For example, the multiplex module 302 is suitable for use as the multiplex modules 114 shown in FIG. 1. The front end 300 includes an antenna switch 304 that is connect to receive RF signals from a primary (Pr) antenna and a diversity (Dv) antenna. In this embodiment, it will be assumed that three RF signals (Rx1, Rx2, Rx3) are output from the antenna switch 304. For example, the RF signals are received by one or both of the primary and the diversity antennas and input to the switch 304. The switch 304 operates to switch selected RF signals to the three outputs. In an exemplary embodiment, each of the RF signals comprises one or more RF carrier signals. For example, the carrier signals may be any of the carrier signals illustrated in FIG. 2, which may be received from either or both of the primary and diversity antennas.

The front end 300 comprises a receiver printed circuit board 306 onto which are mounted the multiplex module 302 and a demodulator 308. The printed circuit board 306 comprises signal traces that route signals between the components mounted to the printed circuit board.

A low noise amplifier having a signal combiner (LNA mux) 310 receives the RF signals (Rx1, Rx2, and Rx3) and combines these signals into a combined RF signal 312 that is output from the LNA mux 310. The combined RF signal 312 is routed using a single signal trace of the PCB 306 to an LNA having a signal de-multiplexer (LNA demux) 314. Since the RF signals have been multiplexed together, they are routed over the same signal trace to the LNA demux 314.

The LNA demux 314 receives the combined RF signal that is output from the LNA mux 310 and routed over the signal trace of the PCB 306. The LNA demux 314 distributes the combined RF signal to multiple down-converters of the demodulator 308 for RF demodulation. Each down-converter uses an associated local oscillator to down-convert a carrier signal of interest. Thus, in various exemplary embodiments, the multiplex module 302 operates to receive and route multiplexed RF signals to a demodulator of a carrier aggregation receiver. It should be noted that the LNA mux 310 and the LNA demux 314 comprises separate components that are located at different locations on the PCB 306 and that the received RF signals are routed between the LNA mux 310 and the LNA demux 314 using a single signal trace.

Figure 4:
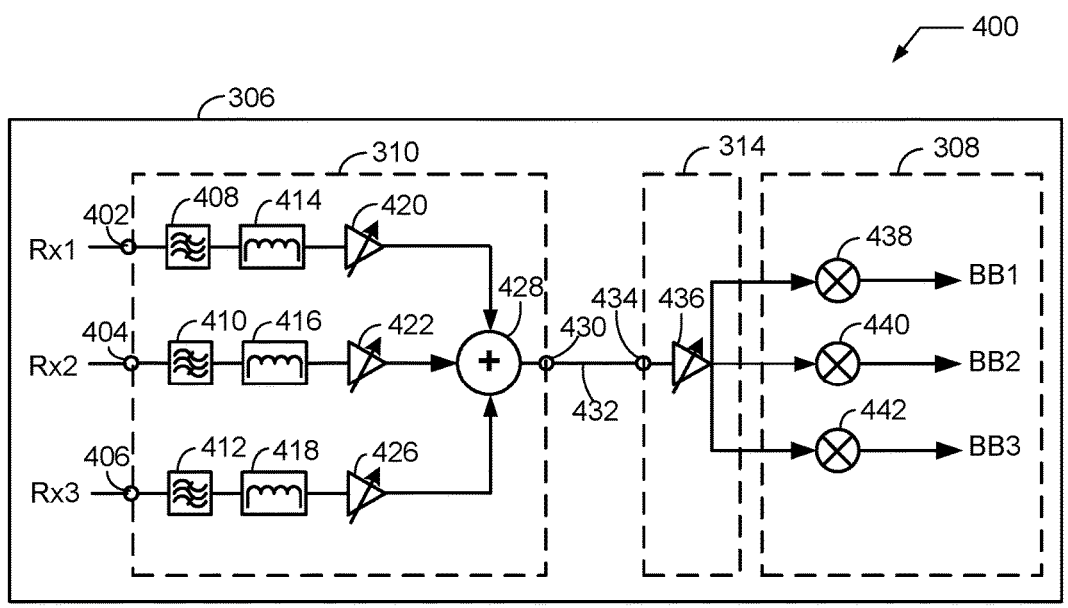
FIG. 4 shows exemplary detailed embodiments of an LNA mux and an LNA demux of the multiplex module shown in FIG. 3.

FIG. 4 shows exemplary detailed embodiments of the LNA mux 310 and the LNA demux 314 of the multiplex module 302 shown in FIG. 3. In an exemplary embodiment, an LNA mux 310 comprises optional filters 408, 410 and 412, matching circuits 414, 416 and 418, and adjustable LNAs 420, 422 and 426. The LNA mux 310 also comprises a combining circuit 428.

In an exemplary embodiment, the first RF signal Rx1 is input to the LNA mux 310 at input terminal 402. The Rx1 signal flows from terminal 402 to the filter 408 where it is appropriately filtered to remove any unwanted signal. The filtered signal output from the filter 408 is input to the matching circuit 414, which provides impedance matching to prevent signal loss. The output of the matching circuit 414 is input to the adjustable amplifier 420, which amplifies the signal by a selected gain factor. The amplified signal is then input to the combining circuit 428.

In an exemplary embodiment, the second RF signal Rx2 is processed by the optional filter 410, matching circuit 416, and adjustable LNA 422 as describe above with respect to the first RF signal Rx1. The filtered and amplified Rx2 signal output from the amplifier 422 in then input to the signal combiner 428. Similarly, the third RF signal Rx3 is processed by the filter 412, matching circuit 418, and adjustable LNA 426 as describe above with respect to the first RF signal Rx1. The filtered and amplified Rx3 signal output from the amplifier 426 in then input to the signal combiner 428.

The combining circuit 428 combines the signals at its inputs to generate a combined signal 432 that is output from the terminal 430. Thus, the combined signal 432 comprises the first RF signal (Rx1), the second RF signal (Rx2), and the third RF signal (Rx3). In an exemplary embodiment, the three RF signals comprise three carrier signals in selected band groups as illustrated in FIG. 2. The combined signal 432 is input to an input terminal 434 of the LNA demux 314

In an exemplary embodiment, the LNA demux 314 comprises an adjustable LNA 436. The LNA 436 amplifies the combined signal and distributes an amplified version of the combined signal to mixer circuits 438, 440 and 442 of the demodulator 308. The mixer circuits 438, 440 and 442 downconvert the output of the adjustable LNA 436 to generate baseband information signals using corresponding local oscillator (LO) signals. The LO signals are not shown for simplicity of illustration; however, each mixer circuit utilizes its own LO signal so that each mixer circuit can downconvert any desired carrier signal that may be included in the combined RF signal 432.

In an exemplary embodiment, the routing of the combined signal 432 on the PCB 306 between the LNA mux 310 the LNA demux 314 is simplified because one physical connection (or signal path) from terminal 430 to terminal 434 is used to transfer, in this example, three RF signals.

Figure 5:
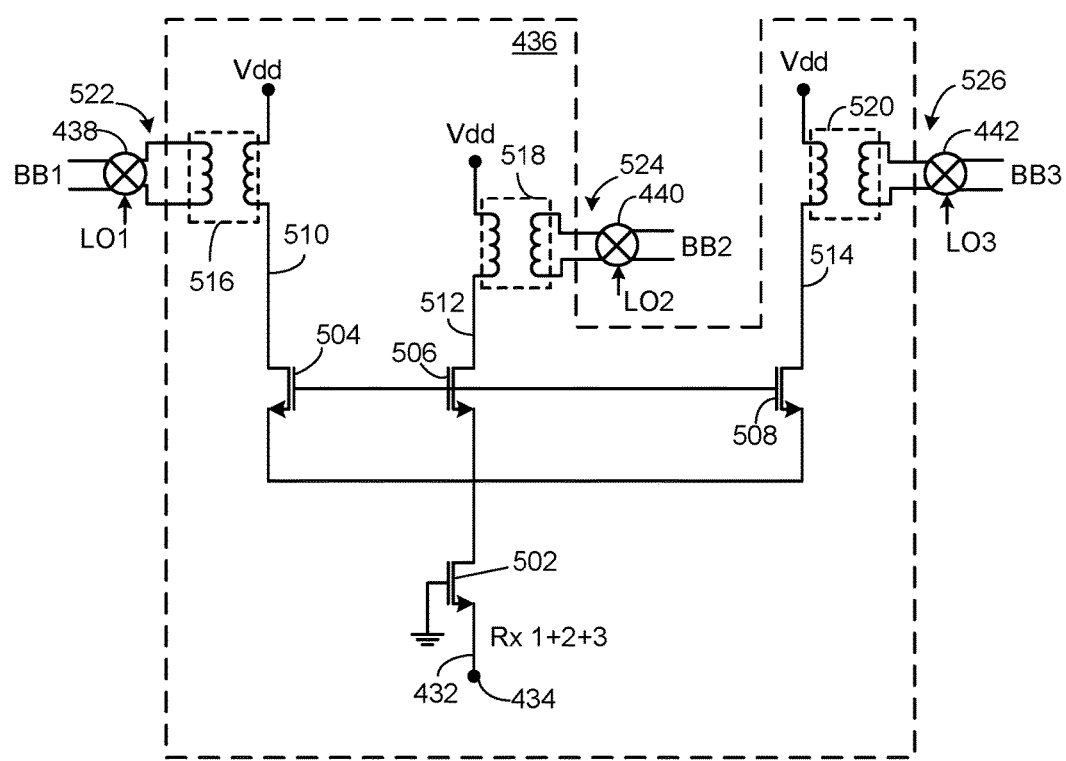
FIG. 5 shows an exemplary detailed embodiment of the LNA demux shown in FIG. 4.

FIG. 5 shows an exemplary detailed embodiment of the adjustable LNA 436 of the LNA demux 314 shown in FIG. 4. In an exemplary embodiment, the adjustable LNA 436 operates to distribute the combined RF signal 432 (Rx 1+2+3) so that each RF signal can be demodulated by the appropriate mixer (downconverter).

The adjustable LNA 436 comprises a gain transistor 502 and cascode transistors 504, 506 and 508. The drain terminal of the transistor 502 is coupled to the source terminals of the transistors 504, 506 and 508. The gate terminal of the transistor 502 is coupled to signal ground in a common gate configuration. The combined RF signal 432 on terminal 434 is applied to the source terminal of the transistor 502.

In an exemplary embodiment, the combined RF signal flows from the drain terminal of the transistor 504, over connection 510 to a transformer 516. In an exemplary embodiment, the transformer 516 provides single-ended to differential conversion and provides the combined RF signal as a differential signal over connections 522 to the mixer circuit 438. The mixer 438 receives a local oscillator (LO) signal LO1 and uses this signal to demodulate a first selected carrier signal from the combined RF signal. The demodulated first carrier signal results in a first baseband signal (BB1) being output from the mixer 438.

In an exemplary embodiment, the combined RF signal flows from the drain terminal of the transistor 506, over connection 512 to a transformer 518. In an exemplary embodiment, the transformer 518 provides single-ended to differential conversion and provides the combined RF signal as a differential signal over connections 524 to the mixer circuit 440. The mixer 440 receives a local oscillator signal LO2 and uses this signal to demodulate a second selected carrier signal from the combined RF signal. The demodulated second carrier signal results in a second baseband signal (BB2) being output from the mixer 440.

In an exemplary embodiment, the combined carrier signal flows from the drain terminal of the transistor 508, over connection 514 to a transformer 520. In an exemplary embodiment, the transformer 520 provides single-ended to differential conversion and provides the combined RF signal as a differential signal over connections 526 to the mixer circuit 442. The mixer 442 receives a local oscillator signal LO3 and uses this signal to demodulate a third selected carrier signal from the combined RF signal. The demodulated third carrier signal results in a third baseband signal (BB3) being output from the mixer 442.

Thus, in various exemplary embodiments, the LNA 436 operates to receive a combined RF signal and routes this signal to the appropriate demodulators to allow individual carriers in the combined RF signal to be demodulated to generate the corresponding baseband signals.

Figure 6:
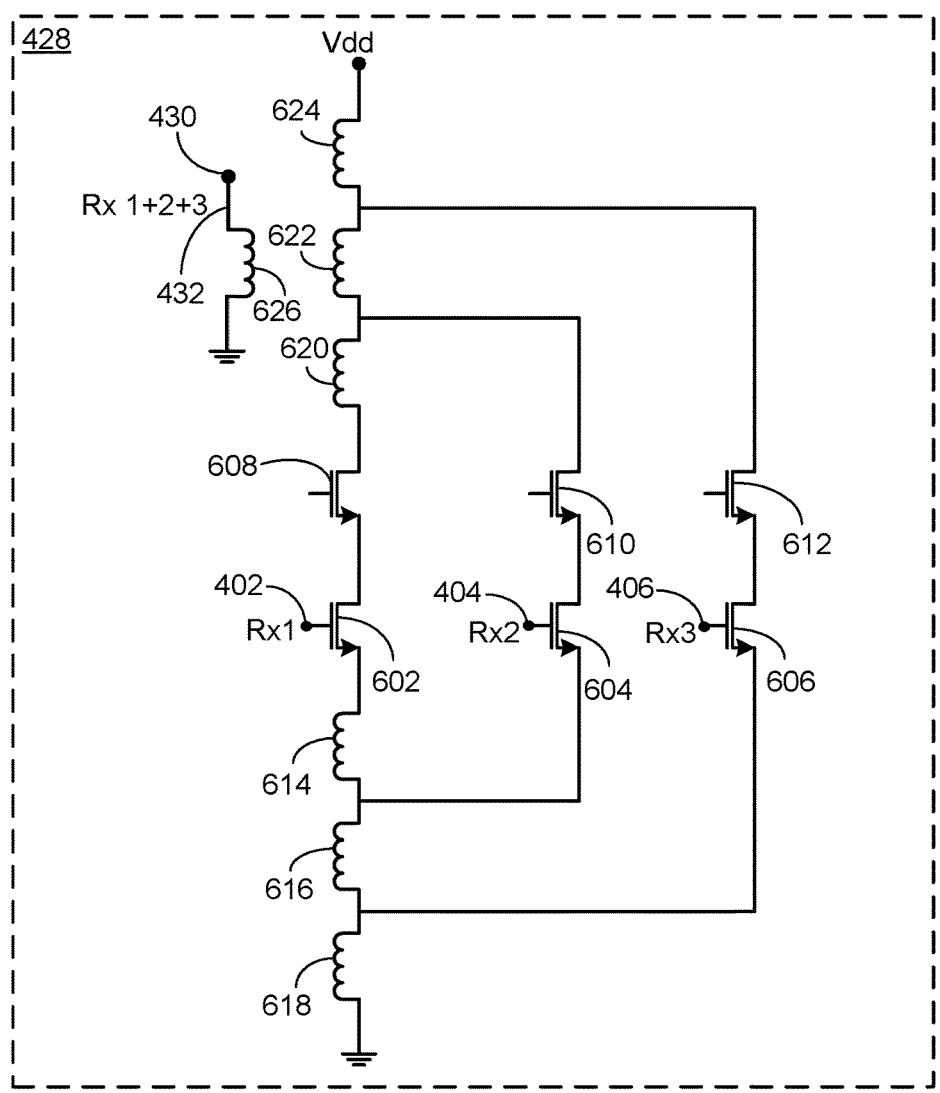
FIG. 6 shows a detailed exemplary embodiment of the LNA mux shown in FIG. 4.

FIG. 6 shows a detailed exemplary embodiment of the signal combiner 428 of the LNA mux 310 shown in FIG. 4. In exemplary embodiment, the signal combiner 428 combines the three RF signals Rx1, Rx2 and Rx3 into the combined RF signal 432 that appears at terminal 430. It will be assumed that the optional filters 408, 410 and 412, matching circuits 414, 416 and 418, and adjustable LNAs 420, 422 and 426 are not used such that the RF signals presented at the terminals 402, 404 and 406 are input directly to the signal combiner 428.

The signal combiner 428 comprises gain transistors 602, 604, 606 and respective cascode transistors 608, 610 and 612. In an exemplary embodiment, the signal combiner 428 also comprises degeneration inductors 614, 616 and 618, and load inductors 620, 622 and 624.

The source of the transistor 602 is coupled to the inductor 614 so that the source degeneration provided to the transistor 602 comprises the inductors 614, 616 and 618. The source of the transistor 604 is coupled to the node between the inductors 614 and 616 so that the source degeneration provided to the transistor 604 comprises the inductors 616 and 618. The source of the transistor 606 is coupled to the node between the inductors 616 and 618 so that the source degeneration provided to the transistor 606 comprises the inductor 618.

The drain of the transistor 602 is coupled to the source of the transistor 608. The drain of the transistor 604 is coupled to the source of the transistor 610, and the drain of the transistor 606 is coupled to the source of the transistor 612.

The first RF signal (Rx1) from connection 402 is coupled to the gate terminal of the transistor 602, the second RF signal (Rx2) from connection 404 is coupled to the gate terminal of the transistor 604, and the third RF signal (Rx3) from connection 406 is coupled to the gate terminal of the transistor 606.

The drain terminal of the transistor 608 is coupled to the load inductor 620, so that the load at the drain of the transistor 608 comprises the inductors 620, 622 and 624. The drain of the transistor 610 is coupled to the node between the load inductor 620 and the load inductor 622, so that the load at the drain of the transistor 610 comprises the inductors 622 and 624. The drain of the transistor 612 is coupled to the node between the load inductor 622 and the load inductor 624, so that the load at the drain of the transistor 612 comprises the inductor 624. The load inductors 620, 622 and 624 are inductively coupled to an inductor 626, which provides the combined output signal 432 (Rx 1+2+3) at the terminal 430.

Figure 7:
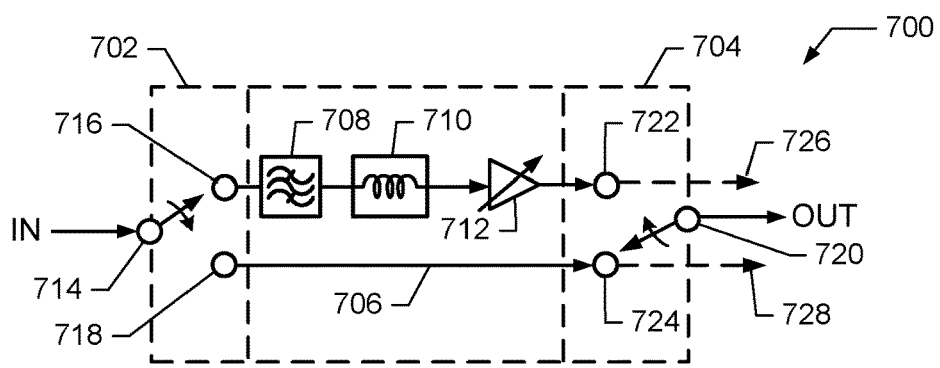
FIG. 7 shows a detailed exemplary embodiment of a multiplex module.

FIG. 7 shows a detailed exemplary embodiment of a multiplex routing module (MRM) 700. For example, the MRM 700 is suitable for use as the multiplex modules 114 shown in FIG. 1 to efficiently route RF signals from an antenna to a demodulator for demodulation.

The MRM 700 comprises input switch 702, output switch 704, feed-through signal path 706, filter 708, matching circuit 710, and variable gain amplifier 712. An RF signal received at an input terminal 714 of the input switch 702 is connected flow to the feed-through path 706 or to the filter 708. If the input switch 702 connects the input terminal 714 to the terminal 718 that is connected to the feed-through path, the input RF signal flows through the feed-through path 706 to a first terminal 724 of the output switch 704. If the input switch 702 connects the input terminal 714 to the terminal 716 that is connected to the filter 708, the input RF signal flows to the filter 708 where it is filtered and a filtered output is then input to the matching circuit 710. The matching circuit 710 provides matching characteristics to reduce loss or distortion of the filtered signal. The output of the matching circuit 710 is input to the variable gain amplifier 712 where amplification is provided to the filtered signal to generate an amplified filtered signal that flows to a second terminal 722 of the output switch 704.

The output switch 704 has an output terminal 720 that is connected to either the first 724 or second 722 terminals to allow the RF signal to be output from the multiplex routing module 700. In an alternative embodiment, the terminal 724 outputs a signal 728 that flows on the bypass path 706. The terminal 722 outputs a signal 726 that flows through the non-bypass path. In various exemplary embodiments, the multiplex routing module 700 efficiently routes RF signals in one or more bands to a demodulator in a receiver front end.

Figure 8:
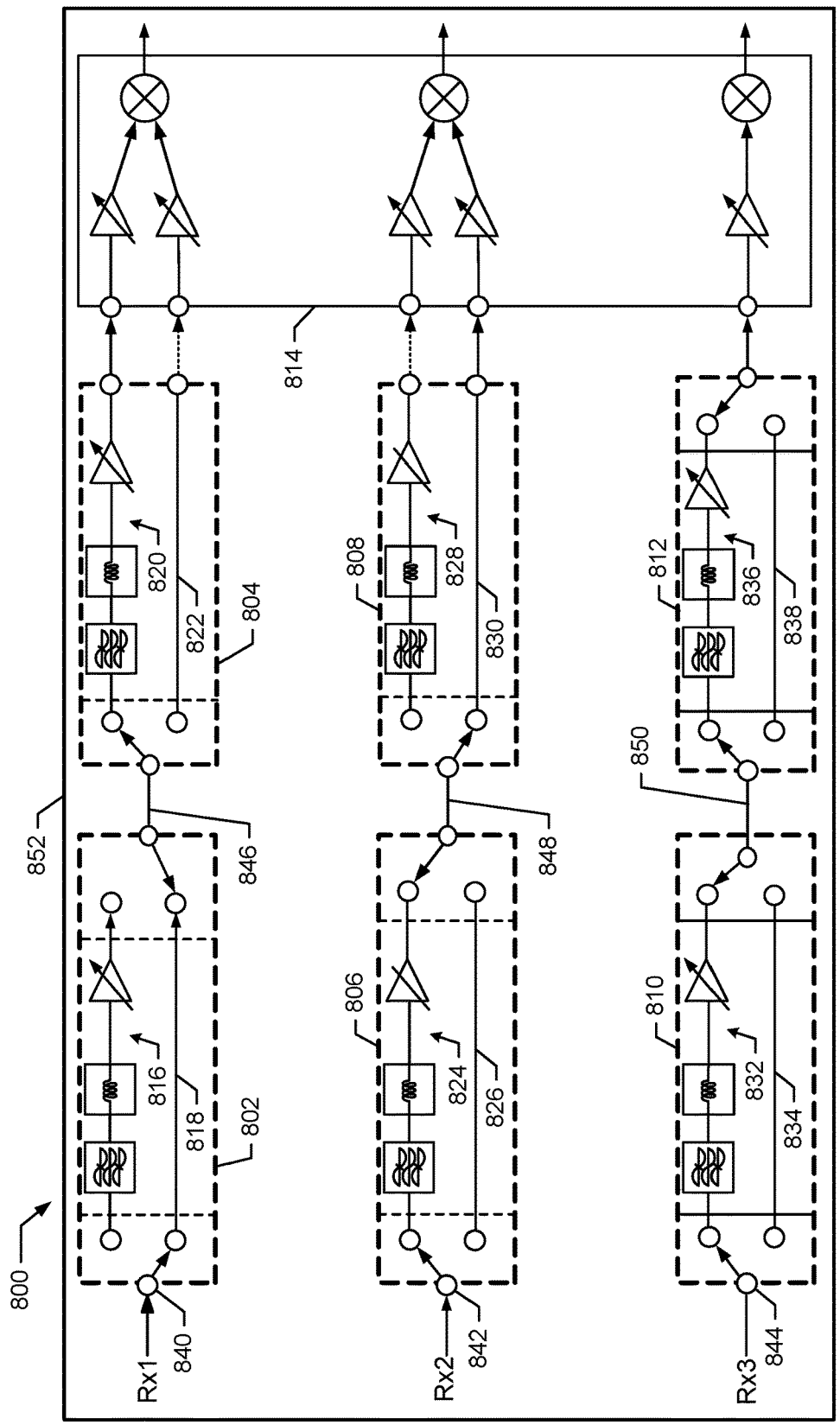
FIG. 8 shows a block diagram of a receiver front end that comprises exemplary embodiments of the multiplex module shown in FIG. 7.

FIG. 8 shows a block diagram of a receiver front end 800 that comprises exemplary embodiments of the multiplex routing module 700 shown in FIG. 7. For example, the multiplex routing module 700 is suitable for use as the multiplex routing modules (MRM) 802, 804, 806, 808, 810, and 812 shown in FIG. 8. In this exemplary embodiment, it will be assumed that three RF signals (Rx1, Rx2, and Rx3) are received by the multiplex modules 802, 806 and 810. In an exemplary embodiment, the RF signals may be received from the primary and/or diversity antennas through the antenna switch 304 shown in FIG. 3.

The front end 800 comprises a printed circuit board 852 onto which are mounted the multiplex routing modules 802, 804, 806, 808, 810, and 812, and a demodulator 814. The printed circuit board comprises signal traces that route signals between the components mounted to the printed circuit board.

The MRM 802 receives the Rx1 signal at its input terminal 840 and selects a signal path through which the Rx1 signal will flow. A first signal path 816 comprises a filter, matching network, and amplifier (FMA) and a second signal path comprises a bypass signal path 818. In this example, the input switch and the output switch of the MRM 802 are set to select the bypass path 818, which outputs the Rx1 signal along path 846 that is input to the input switch of the MRM 804. The MRM 804 also routes the signal it receives through one of a FMA path 820 or a bypass path 822. In this example, the input switch of the MRM 804 is set to select the FMA path 820, which outputs a filtered and amplified signal that is input to the demodulator 814. In this example, each of the paths 820 and 822 have a separate input into the demodulator 814, thereby facilitating separate processing of each path by the demodulator. In an exemplary embodiment, the signal path selected to route the Rx1 signal is configured to provide filtering and gain adjustment by MRM 804, which is close to the demodulator. This configuration can be used when the desired signal (Rx1) is received with good signal to noise ratio (SNR) (e.g., signal power of −60 dBm).

The MRM 806 receives the Rx2 signal at its input terminal 842 and selects a signal path through which the Rx2 signal will flow. A first signal path 824 comprises a filter, matching network, and amplifier (FMA) and a second signal path comprises a bypass path 826. In this example, the input and output switches of the MRM 806 are set to select the FMA path 824, which outputs a filtered and amplified signal along path 848 that is input to the MRM 808. The MRM 808 routes the signal it receives through one of an FMA path 828 or a bypass path 830. In this example, the input switch of the MRM 806 is set to select the bypass path 830, which outputs the filtered and amplified Rx2 signal, which is then input to the demodulator 814. In this example, each of the paths 828 and 830 have a separate input into the demodulator 814, thereby facilitating separate processing of each path by the demodulator. In an exemplary embodiment, the signal path selected to route the Rx2 signal is configured to provide filtering and gain adjustment by MRM 806, which is close to the antenna switch. This configuration can be used when there the desired signal (Rx2) is received with average SNR (e.g., signal power of −80 dBm).

The MRM 810 receives the Rx3 signal at its input terminal 844 and selects a signal path through which the Rx3 signal will flow. A first signal path 832 comprises a filter, matching network, and amplifier (FMA) and a second signal path comprises a bypass path 834. In this example, the input and output switches of the MRM 810 are set to select the FMA path 832, which outputs a filtered and amplified signal along signal path 850 that is input to the input switch of the MRM 812. The MRM 812 routes the signal it receives through one of a FMA path 836 or a bypass path 838. In this example, the input and output switches of the MRM 812 are set to select the FMA path 836, which provides additional filtering and amplification to the Rx3 signal. The output of the MRM 812 is input to the demodulator 814. In this example, both of the paths 836 and 838 have the same input into the demodulator 814, thereby facilitating the same processing of each path by the demodulator. In an exemplary embodiment, the MRMs 810 and 812 are configured to provide filtering and gain adjustment by both of the MRM 810 and the MRM 812. This configuration can be used when there the desired signal (Rx3) is received with poor SNR (e.g., signal power of −100 dBm).

Thus, in various exemplary embodiments, the multiplex routing modules 802, 804, 806, 808, 810 and 812 operate to receive and route RF signals to a demodulator. It should be noted that the configuration of the front end 800 is exemplary and that other configurations and/or routing paths using the same number or a different number of MRMs are possible within the scope of the exemplary embodiments.

Figure 9:
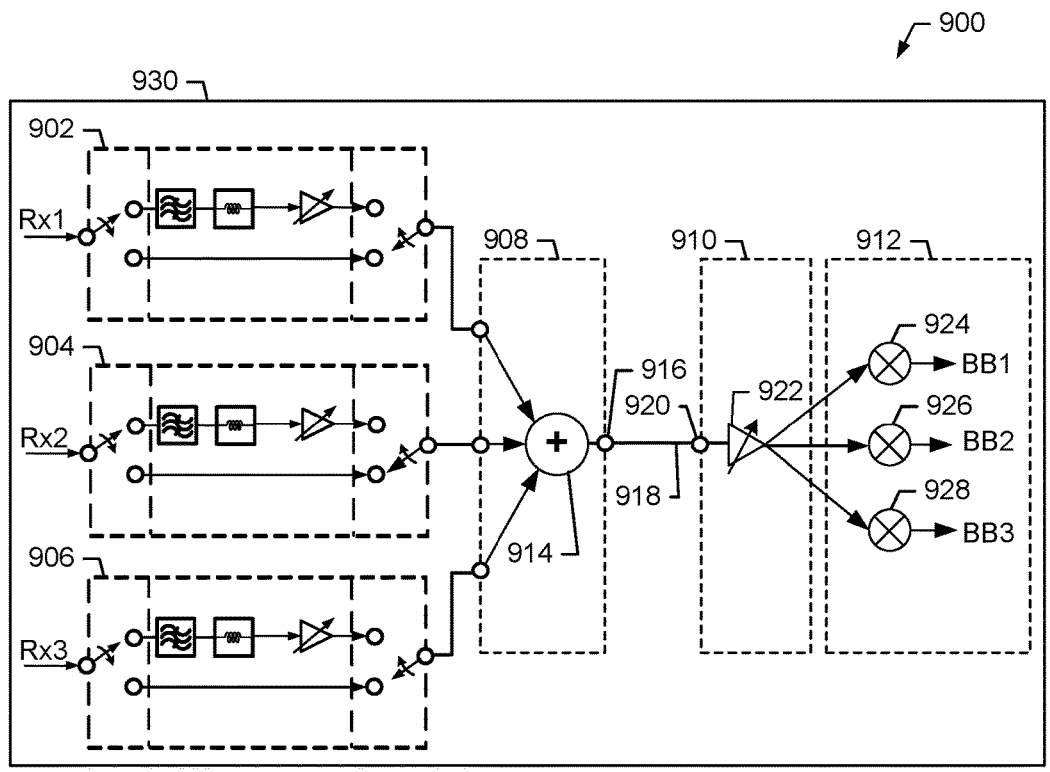
FIG. 9 shows a block diagram of a receiver front end that comprises exemplary embodiments of the multiplex module shown in FIG. 4 and the multiplex routing module shown in FIG. 7.

FIG. 9 shows a block diagram of a receiver front end 900 that comprises exemplary embodiments of the multiplex module shown in FIG. 4 and the multiplex routing module shown in FIG. 7. In an exemplary embodiment, the front end 900 comprises MRMs 902, 904, and 906 that receive RF signals Rx1, Rx2, and Rx3 from, for example, the antenna switch 304. Each of the MRMs 902, 904, and 906 routes their respective RF signals through FMA paths or bypass paths as selected by their input and output switches to generate outputs signals that are input to an LNA mux 908. In an exemplary embodiment, the LNA mux 908 comprises a combining circuit 914, which in an exemplary embodiment is configured as the combining circuit shown in FIG. 6. The LNA mux 908 sums together the outputs of the MRM 902, 904, and 906 and outputs a combined RF signal 918 that is output from the output terminal 916 and routed to an input terminal 920 of an LNA demux 910. The components of the front end 900 are mounted on printed circuit board 930, such that a single signal trace carries the combined RF signal 918 to the LNA demux 910. In an exemplary embodiment, the LNA demux 910 is configured as the LNA demux shown in FIG. 5. The LNA demux 910 distributes the received combined RF signal 918 and provides amplified outputs to mixers 924, 926, and 928 of demodulator 912. The outputs of the mixers are the baseband signals BB1, BB2, and BB3.

Thus, the MRMs 902, 904, and 906 route received RF signals along a selected path (FMA or bypass) to the LNA mux 908 which combines the three signals into the combined output 918. This combined output can be routed across the printed circuit board 930 and each of the RF signals will flow over an identical signal path. The LNA demux 910 distributes the combined signal to a demodulator where the RF signals are demodulated using the appropriate LO signals to generate the desired baseband signals. Accordingly, the various multiplex modules operate to efficiently route signals in a carrier aggregation receiver.

Figure 10:
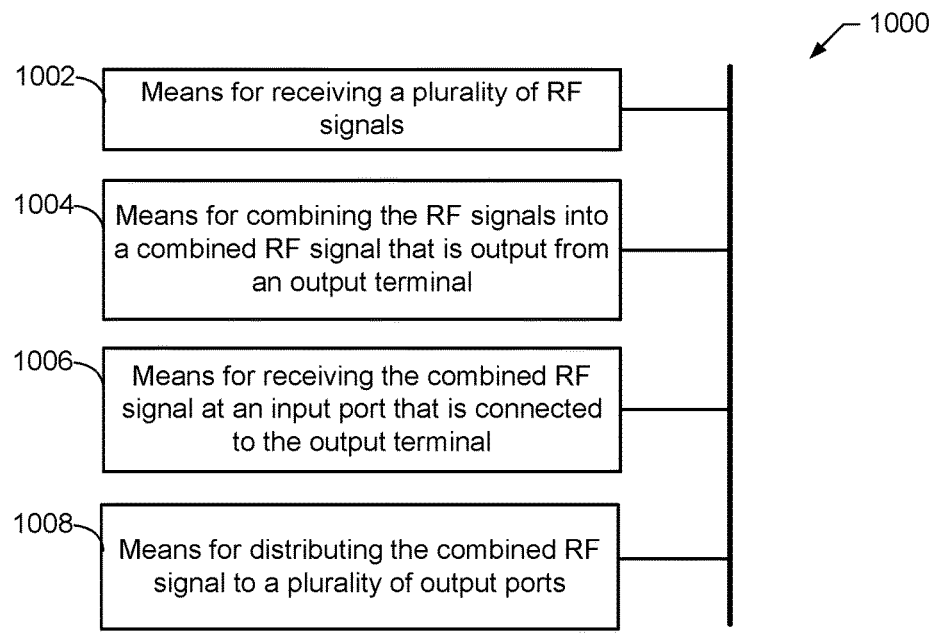
FIG. 10 shows an exemplary embodiment of a multiplexing apparatus.

FIG. 10 shows an exemplary embodiment of a multiplex module apparatus 1000. In an exemplary embodiment, the apparatus 1000 is suitable for use as the multiplex module 400 shown in FIG. 4.

The apparatus 1000 includes a first means (1002) for receiving a plurality of RF signals, which in an exemplary embodiment comprises the input terminals 402, 404, and 406. The apparatus 1000 also includes a second means (1004) for combining the RF signals into a combined RF signal that is output from an output terminal, which in an exemplary embodiment comprises the LNA multiplexer 310. The apparatus 1000 also comprises a third means (1006) for receiving the combined RF signal at an input port that is connected to the output terminal, which in an exemplary embodiment comprises the input port 434. The apparatus 1000 also comprises a fourth means (1008) for distributing the combined RF signal to a plurality of output ports, which in an exemplary embodiment comprises the LNA demultiplexer 314.

The exemplary embodiments described herein may be implemented on an IC, an analog IC, an RFIC, a mixed-signal IC, an ASIC, a printed circuit board (PCB), an electronic device, etc. The exemplary embodiments may also be fabricated with various IC process technologies such as complementary metal oxide semiconductor (CMOS), N-channel MOS (NMOS), P-channel MOS (PMOS), bipolar junction transistor (BJT), bipolar-CMOS (BiCMOS), silicon germanium (SiGe), gallium arsenide (GaAs), heterojunction bipolar transistors (HBTs), high electron mobility transistors (HEMTs), silicon-on-insulator (SOI), etc.

An apparatus implementing an exemplary embodiment described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but the disclose is to be accorded the widest scope consistent with the principles and novel features disclosed herein.

The invention claimed is:

1. An apparatus comprising:
a low noise amplifier (LNA) multiplexer configured to receive a plurality of radio frequency (RF) signals at a plurality of input terminals and to combine the plurality of RF signals into a combined RF signal that is output at an output terminal, the LNA multiplexer including a plurality of input signal paths, each input signal path coupleable to a respective input terminal of the plurality of input terminals and configured to receive a respective RF signal of the plurality of RF signals;
an LNA demultiplexer configured to receive the combined RF signal at an input port that is coupled to the output terminal and to distribute the combined RF signal to a plurality of output ports, each output port of the plurality of output ports configured to output the combined RF signal to a respective downconverter of a plurality of downconverters; and
a multiplex routing module (MRM) coupled to a respective input terminal of the plurality of input terminals of the LNA multiplexer, the MRM including at least two selectable signal paths, wherein the MRM comprises:
an input switch configured to provide the respective RF signal to a selected signal path of the at least two selectable signal paths; and
an output switch configured to provide the respective RF signal from the selected signal path to the respective input terminal of the LNA multiplexer.

2. The apparatus of claim 1, the LNA multiplexer comprising a plurality of transistor pairs, each transistor pair of the plurality of transistors pairs including a gain transistor and a cascode transistor, the gain transistor of each transistor pair of the plurality of transistor pairs coupled to the respective input terminal of the plurality of input terminals and configured to receive the respective RF signal of the plurality of RF signals.

3. The apparatus of claim 2, wherein each cascode transistor includes a gate configured to be coupled to a voltage.

4. The apparatus of claim 1, wherein at least one input signal path of the plurality of input signal paths includes a variable gain amplifier.

5. The apparatus of claim 1, wherein each input signal path of the plurality of input signal paths further includes a filter, an impedance matching circuit and a variable gain amplifier.

6. The apparatus of claim 1, the output terminal coupled to the input port by a single signal path.

7. The apparatus of claim 6, wherein the LNA multiplexer and the LNA demultiplexer are disposed on a printed circuit board, and wherein the single signal path comprises a single signal trace on the printed circuit board.

8. The apparatus of claim 1, further comprising a demodulator that includes the plurality of downconverters, wherein a particular downconverter of the plurality of downconverters comprises a mixer circuit, and wherein the mixer circuit is configured to demodulate the combined RF signal to generate a selected RF signal.

9. The apparatus of claim 1, further comprising:
a primary antenna;
a diversity antenna; and
a switch coupled to the primary antenna, the diversity antenna, and the LNA multiplexer via the MRM, the switch configured to receive the plurality of RF signals from the primary antenna, the diversity antenna, or both, and to provide each RF signal of the plurality of RF signals to the respective input signal path of the plurality of input signal paths.

10. The apparatus of claim 1, comprising a first signal path and a second signal path coupleable to the output terminal, wherein the first signal path includes one or more signal processing components, and wherein the second signal path is configured to bypass the one or more signal processing components.

11. The apparatus of claim 1, wherein each signal path of the plurality of input signal paths comprises two or more MRMs coupled to the respective input terminal of the plurality of input terminals of the LNA multiplexer.

12. The apparatus of claim 1, the LNA demultiplexer comprising:
   a gain transistor configured to receive the combined RF signal at a source terminal;
   a plurality of transformers coupled to the gain transistor and to the plurality of downconverters.

13. A method comprising:
   combining, at a low noise amplifier (LNA) multiplexer, a plurality of radio frequency (RF) signals to generate a combined RF signal, the plurality of RF signals received at a plurality of input terminals of the LNA multiplexer and via a plurality of input signal paths, each input signal path coupleable to a respective input terminal of the plurality of input terminals and configured to receive a respective RF signal of the plurality of RF signals;
   outputting the combined RF signal from an output terminal of the LNA multiplexer to an input port of an LNA demultiplexer; and
   distributing, at the LNA demultiplexer, the combined RF signal to a plurality of output ports of the LNA demultiplexer, each output port of the plurality of output ports coupled to a respective downconverter of a plurality of downconverters and configured to output the combined RF signal to the respective downconverter of the plurality of downconverters, wherein at least one signal path of the plurality of input signal paths comprises a multiplex routing module (MRM) coupled to the respective input terminal of the plurality of input terminals of the LNA multiplexer, each MRM including two selectable signal paths and an input switch and an output switch, wherein the method further comprises configuring the input switch to provide the respective RF signal to a selected signal path of the two selectable signal paths, and configuring the output switch to provide the respective RF signal from the selected signal path to the respective input terminal of the LNA multiplexer.

14. The method of claim 13, further comprising, prior to combining the plurality of RF signals, selectively routing a first RF signal of the plurality of RF signals to the LNA multiplexer via a bypass path of a first input signal path of the plurality of input signal paths, wherein the bypass path bypasses one or more signal processing components.

15. The method of claim 13, wherein the output terminal of the LNA multiplexer is coupled to the input port of the LNA demultiplexer by a single signal path.

16. The method of claim 15, wherein the LNA multiplexer and the LNA demultiplexer are disposed on a printed circuit board, and wherein the single signal path comprises a single signal trace on the printed circuit board.

17. The apparatus of claim 10, wherein the one or more signal processing components comprises an amplifier.

18. The apparatus of claim 10, wherein the one or more signal processing components comprises a filter.

* * * * *